US012628512B2

(12) United States Patent
Tsai et al.

(10) Patent No.: US 12,628,512 B2
(45) Date of Patent: May 12, 2026

(54) ELECTRONIC DEVICE

(71) Applicant: InnoLux Corporation, Miao-Li County (TW)

(72) Inventors: Chia-Hao Tsai, Miao-Li County (TW); Ming-Chen Liu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 312 days.

(21) Appl. No.: 18/342,935

(22) Filed: Jun. 28, 2023

(65) Prior Publication Data

US 2024/0049528 A1     Feb. 8, 2024

(30) Foreign Application Priority Data

Aug. 4, 2022    (CN) .......................... 202210931990.5

(51) Int. Cl.
*H10K 59/126* (2023.01)
*H10K 59/131* (2023.01)
*H10K 59/80* (2023.01)

(52) U.S. Cl.
CPC ......... *H10K 59/126* (2023.02); *H10K 59/131* (2023.02); *H10K 59/8792* (2023.02)

(58) Field of Classification Search
CPC .............. H10K 59/126; H10K 59/131; H10K 59/8792; H10K 59/123; H10K 59/121; H10K 59/1213; H10K 59/122; H10D 86/423; H10D 86/60; H10D 86/441
See application file for complete search history.

(56) References Cited

U.S. PATENT DOCUMENTS

| | | | | |
|---|---|---|---|---|
| 6,498,369 B1 * | 12/2002 | Yamazaki | .......... | H10D 30/6745 257/E27.111 |
| 8,576,619 B2 * | 11/2013 | Yoon | ................. | G11C 13/0026 365/201 |
| 9,818,812 B2 * | 11/2017 | Kim | ................... | H10K 59/1216 |
| 9,954,005 B2 | 4/2018 | Kimura | | |
| 9,954,044 B2 * | 4/2018 | Oh | ........................ | G02F 1/1368 |
| 10,121,899 B2 | 11/2018 | Moon | | |
| 10,121,986 B2 * | 11/2018 | Lee | ...................... | H10K 59/122 |
| 10,158,076 B2 * | 12/2018 | Koo | .................... | H10K 59/131 |

(Continued)

FOREIGN PATENT DOCUMENTS

WO        2021/171714 A1      9/2021

OTHER PUBLICATIONS

Chinese language office action dated Jan. 22, 2025, issued in application No. TW 112109995.

*Primary Examiner* — Eduardo A Rodela
(74) *Attorney, Agent, or Firm* — McClure, Qualey & Rodack, LLP

(57) ABSTRACT

An electronic device is provided. The electronic device includes a substrate, a thin-film transistor, a first insulating layer, and a pixel electrode. The thin-film transistor is disposed on the substrate, and includes a semiconductor layer, a gate electrode, a source electrode and a drain electrode. The semiconductor layer includes a metal oxide. The first insulating layer is disposed on the thin-film transistor and has a first via hole. The pixel electrode is disposed on the first insulating layer, and is electrically connected to either the source electrode or the drain electrode through the first via hole. In addition, the first via hole at least partially overlaps the gate electrode in a normal direction of the substrate.

18 Claims, 4 Drawing Sheets

(56)     References Cited

U.S. PATENT DOCUMENTS

| | | | |
|---|---|---|---|
| 10,553,667 B2 * | 2/2020 | Bae | G09G 3/3225 |
| 11,404,508 B2 | 8/2022 | Kim | |
| 11,656,514 B2 | 5/2023 | Kimura et al. | |
| 12,002,820 B2 * | 6/2024 | Nishimura | H10D 86/441 |
| 12,268,055 B2 * | 4/2025 | Cho | H10K 59/8722 |
| 2018/0301472 A1 * | 10/2018 | Matsukizono | H10D 86/60 |
| 2021/0288078 A1 | 9/2021 | Suzumura et al. | |
| 2021/0366945 A1 | 11/2021 | Sakai | |
| 2022/0302239 A1 * | 9/2022 | Kim | H10K 77/111 |
| 2023/0126210 A1 * | 4/2023 | Lee | H10K 59/8792 |
| | | | 257/91 |
| 2024/0049526 A1 * | 2/2024 | Im | H10K 59/8792 |

* cited by examiner

10

ELECTRONIC DEVICE

CROSS REFERENCE TO RELATED APPLICATIONS

This application claims the benefit of China Application No. 202210931990.5, filed Aug. 4, 2022, the entirety of which is incorporated by reference herein.

BACKGROUND

Technical Field

The present disclosure is related to an electronic device, and in particular it is related to an electronic device including a thin-film transistor.

Description of the Related Art

Electronic products that are equipped with display panels, including tablet computers, notebook computers, smartphones, displays and televisions, have become an indispensable necessity in modern society. With the rapid development of these consumer electronics, consumers have high expectations regarding their quality, functionality, or price.

However, these electronic devices still do not meet the high expectations placed upon them in all respects. For example, as the resolution increases and the area of the pixels decreases, how to increase the aperture ratio of the pixels is still one of the current research topics in the industry.

SUMMARY

In accordance with some embodiments of the present disclosure, an electronic device is provided. The electronic device includes a substrate, a thin-film transistor, a first insulating layer, and a pixel electrode. The thin-film transistor is disposed on the substrate, and includes a semiconductor layer, a gate electrode, a source electrode and a drain electrode. The semiconductor layer includes a metal oxide. The first insulating layer is disposed on the thin-film transistor and has a first via hole. The pixel electrode is disposed on the first insulating layer, and is electrically connected to either the source electrode or the drain electrode through the first via hole. In addition, the first via hole at least partially overlaps the gate electrode in a normal direction of the substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
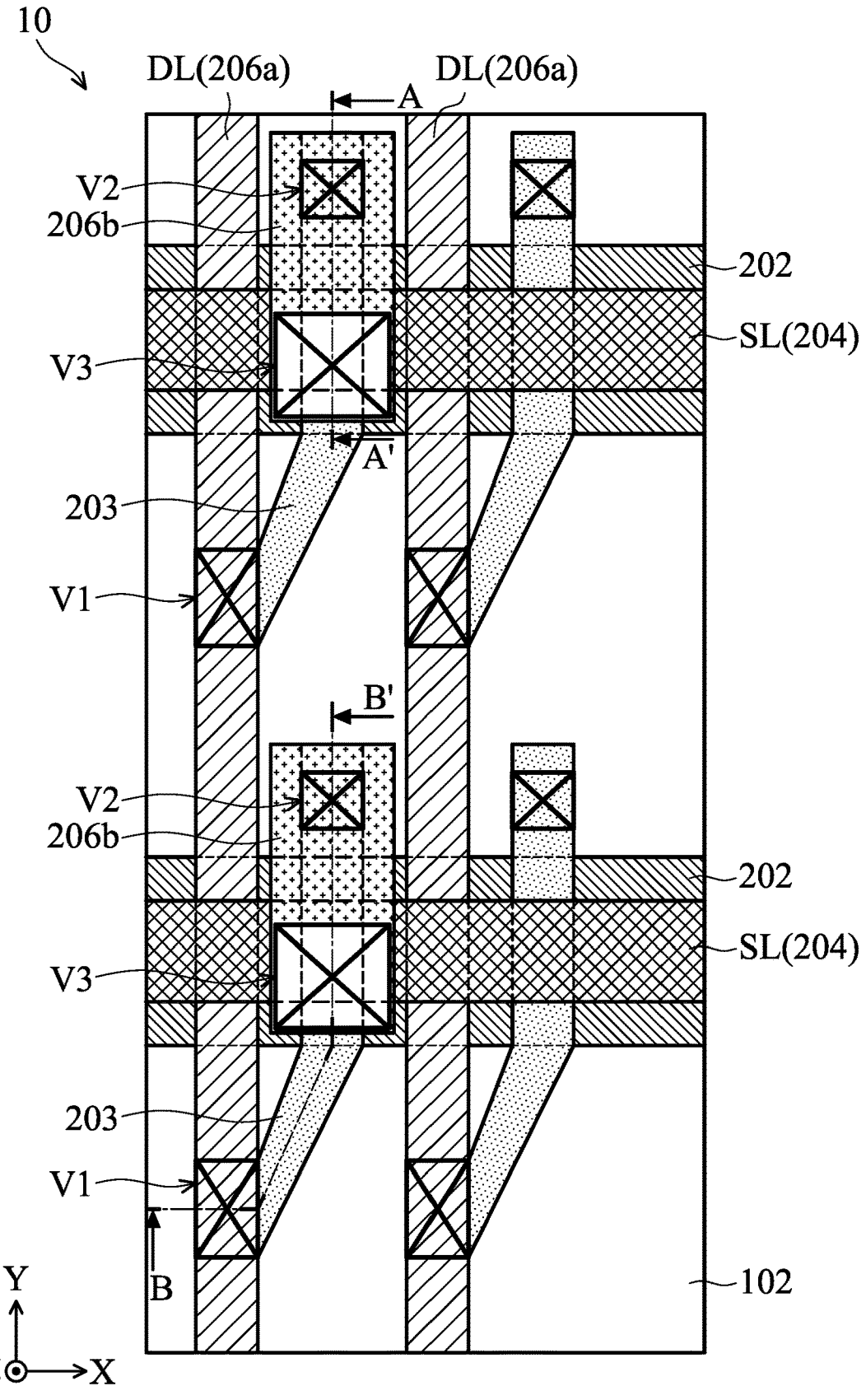
FIG. 1 is a partial top-view diagram of an electronic device in accordance with some embodiments of the present disclosure.

The electronic device according to the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean+/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, an electronic device including a thin-film transistor is provided. In the thin-film transistor, a semiconductor layer and a transfer element (for example, a source electrode or a drain electrode) connecting the semiconductor layer and a pixel electrode are configured in a specific manner. The aperture ratio of the pixel therefore can be effectively increased, and the performance of the electronic device can be improved.

In accordance with the embodiments of the present disclosure, the electronic device may include a display device, an antenna device, a light-emitting device, a sensing device, a tiled device, a touch sensing electronic device, a curved electronic device or a non-rectangular electronic device, but it is not limited thereto. The electronic device may, for example, include liquid crystal, light-emitting diode, quantum dot (QD), fluorescence, phosphor, another suitable display medium, or a combination thereof, but it is not limited thereto. The display device may be a non-self-luminous display device or a self-luminous display device. The electronic device may include electronic components. The electronic components may include passive components and active components, such as capacitors, resistors, inductors, diodes, transistors, and the like. The diode may include a light-emitting diode (LED) or a photodiode. The light-emitting diode may include organic light-emitting diode (OLED), mini light-emitting diode (mini LED), micro-light-emitting diodes (micro LED) or quantum dot light-emitting diode (quantum dot LED), but it is not limited thereto. The antenna device may be a liquid-crystal type antenna device or a non-liquid crystal type antenna device. The sensing device may be a sensing device for sensing capacitance, light, thermal energy or ultrasonic waves, but it is not limited thereto. The tiled device may be, for example, a display tiled device or an antenna tiled device, but it is not limited thereto. It should be noted that the electronic device may be any permutation and combination of the aforementioned, but the present disclosure is not limited thereto. In addition, the electronic device may be a bendable or flexible electronic device. In addition, the shape of the electronic device may be rectangular, circular, polygonal, with curved edges, or other suitable shapes. The electronic device may have peripheral systems such as a driving system, a control system, a light source system, etc. to support a display device, an antenna device, a wearable device (e.g., including an augmented reality (AR) device or a virtual reality (VR) device), a vehicle-mounted device (e.g., including a car windshield), or a tiled device. For the convenience of description, the electronic device will be described below as a display device, but the present disclosure is not limited thereto.

Figure 2:
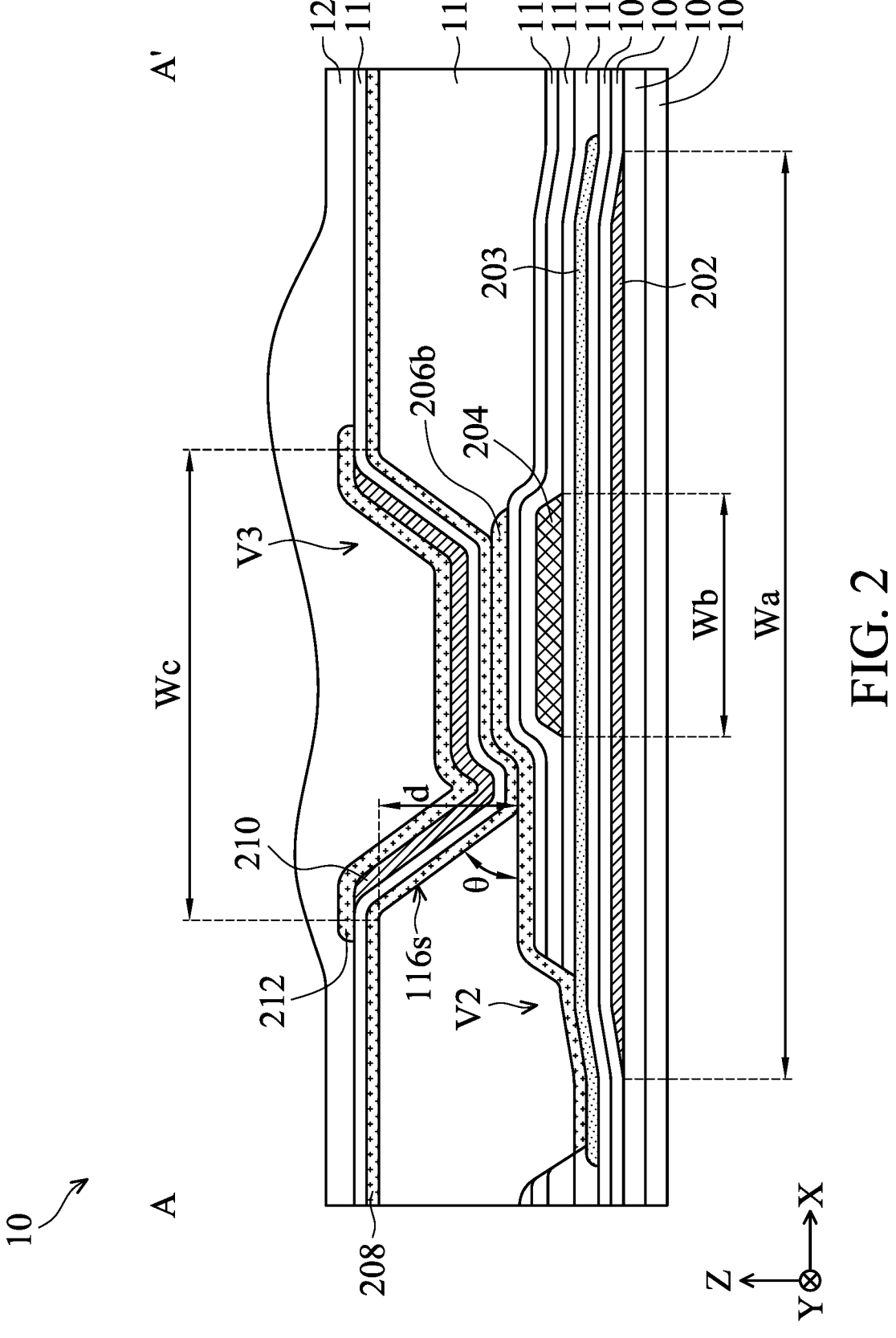
FIG. 2 is a cross-sectional diagram of an electronic device corresponding to the section line A-A' in FIG. 1 in accordance with some embodiments of the present disclosure.
Figure 3:
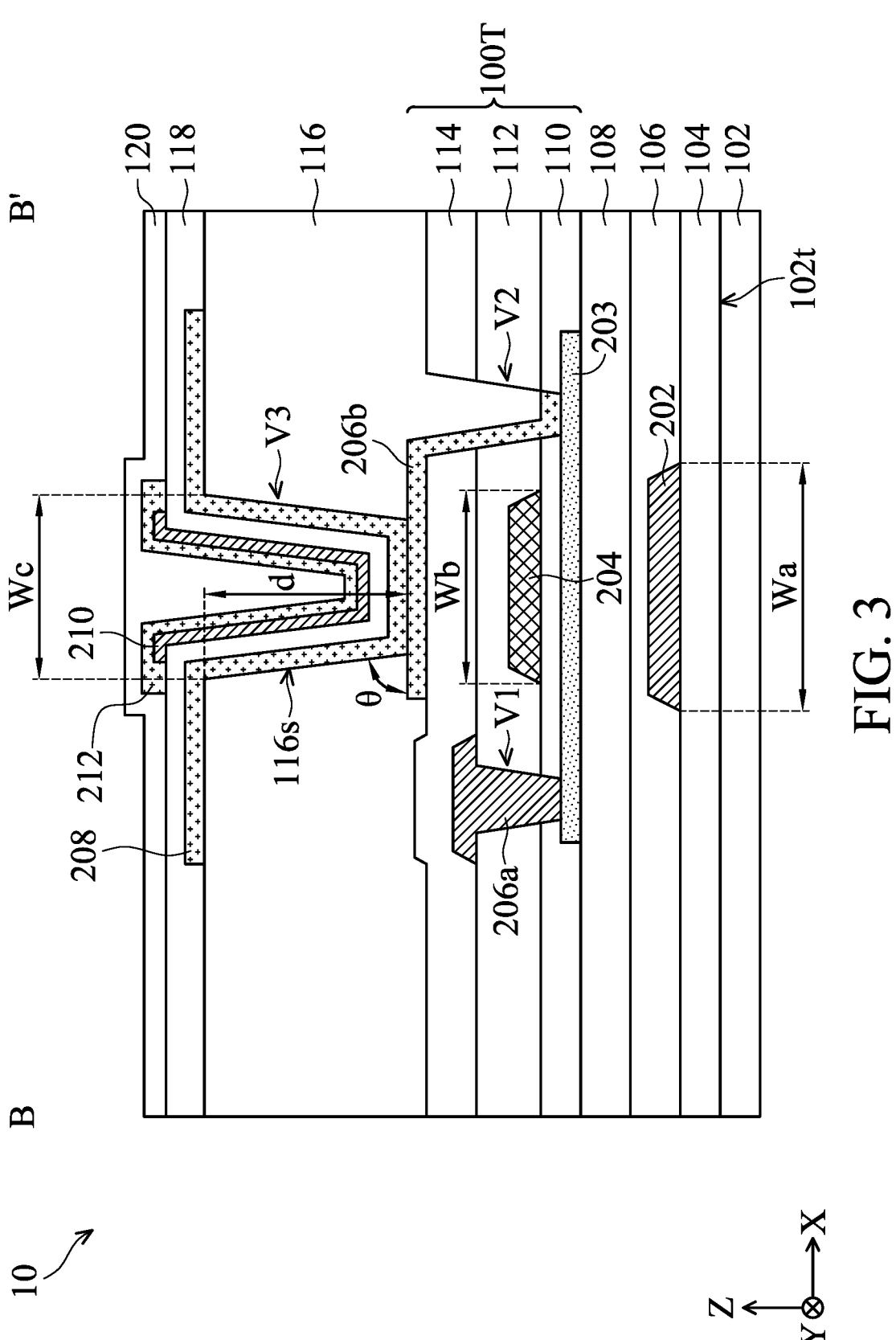
FIG. 3 is a cross-sectional diagram of an electronic device corresponding to the section line B-B' in FIG. 1 in accordance with some embodiments of the present disclosure.

Please refer to FIG. 1, FIG. 2 and FIG. 3. FIG. 1 is a partial top-view diagram of an electronic device 10 in accordance with some embodiments of the present disclosure. FIG. 2 is a cross-sectional diagram of the electronic device 10 corresponding to the section line A-A' in FIG. 1 in accordance with some embodiments of the present disclosure. FIG. 3 is a cross-sectional diagram of the electronic device 10 corresponding to the section line B-B' in FIG. 1 in accordance with some embodiments of the present disclosure. It should be understood that, some elements of the electronic device 10 are omitted in the drawings for clarity, and only some elements are schematically shown. Furthermore, FIG. 1 only shows some components in FIG. 2 and FIG. 3. In accordance with some embodiment, additional features may be added to the electronic device 10 described below.

As shown in FIG. 1, FIG. 2 and FIG. 3, the electronic device 10 may include a substrate 102 and a thin-film transistor 100T, and the thin-film transistor 100T may be disposed on the substrate 102. In accordance with some embodiments, the substrate 102 can be used as a driving substrate, and the electronic device 10 includes a driving circuit (not illustrated) disposed on the substrate 102, and the driving circuit includes an active driving circuit or a passive driving circuit. In accordance with some embodiments, the electronic device 10 includes a plurality of data lines DL and a plurality of scan lines SL disposed on the substrate 102. The data lines DL and the scan lines SL are intersected to define a plurality of pixel units (such as sub-pixels, not labeled), and these pixel units are respectively provided with thin-film transistors 100T. In accordance with some embodiments, the thin-film transistor 100T includes a switching transistor, a driving transistor, a reset transistor, or another thin-film transistor, but is not limited thereto. It should be understood that although the thin-film transistor 100T shown in the drawings has a top gate thin-film transistor structure, the thin-film transistor 100T may also have a bottom gate thin-film transistor structure or a dual gate or double gate thin-film transistor structure in accordance with some embodiments. For example, in accordance with some embodiments, the light-shielding layer 202 can be used as a bottom gate, forming a dual gate or double gate thin-film transistor structure with a top gate thin-film transistor structure.

Specifically, in accordance with some embodiments, the thin-film transistor 100T includes a semiconductor layer 203, a gate electrode 204, a source electrode 206a, and a drain electrode 206b. In accordance with some embodiments, the electronic device 10 further includes an insulating layer 104, an insulating layer 106, an insulating layer 108, an insulating layer 110, an insulating layer 112, and an insulating layer 114 sequentially disposed on the substrate 102. The semiconductor layer 203 is disposed on the insulating layer 108. The gate electrode 204 is disposed on the insulating layer 110 and the semiconductor layer 203. In addition, the insulating layer 110 is disposed between the semiconductor layer 203 and the gate electrode 204.

In accordance with some embodiments, the semiconductor layer 203 includes a doped region (not illustrated) with a suitable dopant and a channel region (not illustrated). For example, a channel region can be disposed between two doped regions with different conductivity properties (e.g., p-type and n-type). The gate electrode 204 overlaps with the semiconductor layer 203 in the normal direction of the substrate 102 (for example, the normal direction of the top surface 102*t* of the substrate 102, i.e. the Z direction in the drawing). The semiconductor layer 203 overlapping with the gate electrode 204 can be regarded as a channel region. The source electrode 206*a* and the drain electrode 206*b* are electrically connected to the doped regions on both sides of the semiconductor layer 203 respectively, and the doped regions can serve as a source contact and a drain contact respectively. In accordance with some embodiments, the drain electrode 206*b* at least partially overlaps the gate electrode 204 in the normal direction of the substrate 102 (e.g., the normal direction of the top surface 102*t* of the substrate 102, the Z direction in the drawing). Furthermore, the source electrode 206*a* is electrically connected to the source contact of the semiconductor layer 203 through a via hole V1 penetrating the insulating layer 110 and the insulating layer 112. The drain electrode 206*b* is electrically connected to the drain contact of the semiconductor layer 203 through a via hole V2 penetrating the insulating layer 110, the insulating layer 112 and the insulating layer 114. In accordance with some embodiments, the source electrode 206*a* is electrically connected to a data line DL, the drain electrode 206*b* is electrically connected to the pixel electrode 208, and the gate electrode 204 is electrically connected to a scan line SL. In accordance with some embodiments, the source electrode 206*a* is, for example, a portion of the data line DL, and the gate electrode 204 is, for example, a portion of the scan line SL. It should be understood that although the element 206*a* is used as a source electrode and the element 206*b* is used as a drain electrode in the embodiments shown in the present disclosure, according to the adjustment of the driving method, the element 206*a* can be used as a drain electrode and the element 206*b* can be used as a source electrode in accordance with some other embodiments.

The substrate 102 includes a flexible substrate, a rigid substrate or a combination thereof, but is not limited thereto. In accordance with some embodiments, the material of the substrate 102 may include, but not limited to, glass, quartz, sapphire, ceramic, polyimide (PI), polycarbonate (PC), polyethylene terephthalate (PET), polypropylene (PP), another suitable material or a combination thereof. Moreover, in accordance with some embodiments, the substrate 102 may include a metal-glass fiber composite board or a metal-ceramic composite board, but is not limited thereto. In addition, the transmittance of the substrate 102 is not limited. That is, the substrate 102 can be a transparent substrate, a semi-transparent substrate or an opaque substrate.

Moreover, the material of the semiconductor layer 203 includes a metal oxide. In accordance with some embodiments, the metal oxide may include, but not limited to, indium gallium zinc oxide (IGZO), indium zinc oxide (IZO), indium gallium oxide (IGO), indium gallium zinc tin oxide (IGZTO), another suitable material, or a combination thereof. It should be noted that the semiconductor layer 203 is formed of a light-transmitting metal oxide material, thus helping to improve the pixel aperture ratio of the electronic device. In accordance with some embodiments, the material of the semiconductor layer 203 may include metal oxide, amorphous silicon or polysilicon (e.g., low-temp polysilicon (LTPS)), or a combination thereof, but the present disclosure is not limited thereto. In accordance with some embodiments, the semiconductor layer 203 may be formed by a chemical vapor deposition (CVD) process, another suitable method, or a combination thereof. The chemical vapor deposition process may include, for example, a low pressure chemical vapor deposition (LPCVD) process, a low temperature chemical vapor deposition (LTCVD) process, a rapid thermal chemical vapor deposition (RTCVD) process, a plasma enhanced chemical vapor deposition (PECVD) process, an atomic layer deposition (ALD) process, etc., but not limited thereto. Moreover, the semiconductor layer 203 may be patterned by one or more photolithography processes and/or etching processes. In accordance with some embodiments, the photolithography process may include photoresist coating (e.g., spin coating), soft baking, hard baking, mask aligning, exposure, post-exposure baking, developing the photoresist, rinsing, drying, etc., but is not limited thereto. The etching process may include a dry etching process or a wet etching process, but is not limited thereto.

In addition, the electronic device 10 has a display area (not illustrated) and a non-display area (not illustrated) adjacent to the display area. In accordance with some embodiments, the aforementioned thin-film transistor 100T including the semiconductor layer 203 is disposed in the display area, the electronic device 10 has another thin-film transistor (not illustrated) disposed in the non-display area, and the other thin-film transistor disposed in the non-display area includes another semiconductor layer (not illustrated) including polysilicon. In other words, in accordance with some embodiments, the semiconductor layer 203 of the thin-film transistor 100T disposed in the display area is formed of metal oxide, while the semiconductor layer of the thin-film transistor disposed in the non-display area is formed of polysilicon (e.g., low-temp polysilicon (LTPS)). In accordance with some embodiments, the material of another semiconductor layer may include metal oxide, amorphous silicon or polysilicon (e.g., low-temp polysilicon (LTPS)), or a combination thereof, but the present disclosure is not limited thereto.

In accordance with some embodiments, the material of the gate electrode 204 may include a conductive material, such as copper (Cu), silver (Ag), gold (Au), tin (Sn), aluminum (Al), molybdenum (Mo), tungsten (W), chromium (Cr), nickel (Ni), platinum (Pt), titanium (Ti), palladium (Pd), alloys of the aforementioned metals, another suitable conductive material or a combination thereof, but is not limited thereto. In accordance with some embodiments, the gate electrode 204 may be formed by a physical vapor deposition (PVD) process, an electroplating process, an electroless plating process, another suitable method, or a combination thereof. Also, the gate electrode 204 may be patterned by one or more photolithography processes and/or etching processes.

The source electrode 206*a* and the drain electrode 206*b* include a conductive material. In accordance with some embodiments, either the source electrode 206*a* or the drain electrode 206*b* is formed of a transparent conductive material. For example, according to the embodiments illustrated in the present disclosure, the drain electrode 206*b* is formed of a transparent conductive material, and the source electrode 206*a* is formed of a metal material. It should be noted that, as described above, the semiconductor layer 203 is formed of a metal oxide material, and the energy gap between the metal oxide and the transparent conductive material is small, so the source electrode 206*a* or the drain electrode 206*b* formed of a transparent conductive material can be used as a transfer element connecting the semiconductor layer 203 and the pixel electrode 208. In this way, the aperture ratio of the pixel can be further improved. In accordance with some embodiments, the aforementioned transparent conductive material includes transparent conductive oxide (TCO), for example, may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but is not limited thereto. In accordance with some embodiments, the aforementioned metal material may include copper (Cu), aluminum (Al), molybdenum (Mo), tungsten (W), gold (Au), silver (Ag), tin (Sn), chromium (Cr), Nickel (Ni), platinum (Pt), titanium (Ti), iridium (Ir), rhodium (Rh), alloys of the aforementioned metals, another suitable conductive material, or a combination thereof, but is not limited thereto. In accordance with some embodiments, the source electrode 206*a* and the drain electrode 206*b* may be formed by a chemical vapor deposition process, a spin coating process, a physical vapor deposition process, an electroplating process, an electroless plating process, another suitable method, or a combination thereof. In addition, the source electrode 206*a* and the drain electrode 206*b* may be patterned by one or more photolithography processes and/or etching processes.

Furthermore, in accordance with some embodiments, the material of the insulating layer 104 includes an organic material, an inorganic material or a combination thereof. The organic material may include, for example, polyethylene terephthalate (PET), polyethylene (PE), polyethersulfone (PES), polycarbonate (PC), polymethylmethacrylate (PMMA), isoprene, phenol-formaldehyde resin, benzocyclobutene (BCB), perfluorocyclobutane (PECB), another suitable buffer material or a combination thereof, but is not limited thereto. The inorganic material may include, for example, silicon nitride, silicon oxide, silicon oxynitride, another suitable buffer material, or a combination thereof, but is not limited thereto. In accordance with some embodiments, the insulating layer 104 may be formed by a chemical vapor deposition process, a spin coating process, another suitable method, or a combination thereof. Furthermore, the insulating layer 104 may have a single-layer or multi-layer structure.

In accordance with some embodiments, the materials of the insulating layer 106 and the insulating layer 110 includes silicon oxide, silicon nitride, silicon oxynitride, high dielectric constant (high-k) dielectric materials, other suitable dielectric materials, or a combination thereof, but are not limited thereto. The aforementioned high-k dielectric material may include metal oxides, metal nitrides, metal silicides, transition metal oxides, transition metal nitrides, transition metal silicides, metal oxynitrides, metal aluminum salt, zirconate, zircoaluminate, another suitable material, or a combination thereof, but is not limited thereto. In accordance with some embodiments, the insulating layer 106 and the insulating layer 110 may be formed by a chemical vapor deposition process, a physical vapor deposition process, another suitable method, or a combination thereof. Furthermore, the insulating layer 106 and the insulating layer 110 may have a single-layer or multi-layer structure.

In accordance with some embodiments, the materials of the insulating layer 108 and the insulating layer 112 includes a polymer material, for example, may include polybenzobisoxazole (PBO), polyimide, benzocyclobutene (BCB), another suitable polymer material or a combination thereof, but is not limited thereto. In accordance with other embodiments, the insulating layer 108 and the insulating layer 112 may include, but not limited to, silicon nitride, silicon oxide, silicon oxynitride, phosphosilicate glass (PSG), borosilicate glass (BSG), boron-doped phosphosilicate glass (BPSG), another suitable material, or a combination thereof. Furthermore, the insulating layer 108 and the insulating layer 112 may have a single-layer or multi-layer structure. In accordance with some embodiments, the insulating layer 108 and the insulating layer 112 may be formed by a spin-coating process, a chemical vapor deposition process, another suitable method, or a combination thereof.

Furthermore, the material of the insulating layer 114 includes an inorganic insulating material or an organic insulating material. In accordance with some embodiments, the inorganic insulating material may include, for example, silicon nitride, silicon oxide, silicon oxynitride, aluminum oxide, another suitable material, or a combination thereof, but is not limited thereto. In accordance with some embodiments, the organic insulating material may include, for example, perfluoroalkoxy alkane (PFA), polytetrafluoroethylene (PTFE), fluorinated ethylene propylene (FEP), polyethylene, another suitable material, or a combination thereof, but is not limited thereto. Moreover, the insulating layer 114 may have a single-layer or multi-layer structure. In accordance with some embodiments, the insulating layer 114 may be formed by a spin-coating process, a chemical vapor deposition process, another suitable method, or a combination thereof.

Please refer to FIG. 1, FIG. 2 and FIG. 3, the electronic device 10 includes an insulating layer 116 and a pixel electrode 208. The insulating layer 116 is disposed on the thin-film transistor 100T and has a via hole V3. The pixel electrode 208 is disposed on the insulating layer 116 and electrically connected to either the source electrode 206*a* or the drain electrode 206*b* through the via hole V3. In addition, according to the foregoing, the insulating layer 114 can be disposed between the semiconductor layer 203 and the insulating layer 116, the insulating layer 114 has the via hole V2, and either the source electrode 206*a* or the drain electrode 206*b* is electrically connected to the semiconductor layer 203 through the via hole V2. For example, in accordance with the embodiments shown in the present disclosure, the drain electrode 206*b* can be electrically connected to the semiconductor layer 203 through the via hole V2, and the pixel electrode 208 can be electrically connected to the drain electrode 206*b* through the via hole V3.

In addition, the via hole V3 at least partially overlaps the gate electrode 204 in the normal direction of the substrate 102 (e.g., the Z direction in the drawing). In accordance with some embodiments, the pixel electrode 208 at least partially overlaps the gate electrode 204 in the normal direction of the substrate 102. It should be noted that the pixel electrode 208 is electrically connected to the drain electrode 206*b* through the via hole V3 of the insulating layer 116, and the via hole V3 is disposed above the gate electrode 204, so the gate electrode 204 can be used to shield light and reduce light leakage of via hole V3 or increase the contrast. In this way, the increased area of other elements in order to shield the light leakage of the via hole V3 can be reduced (for example, the area of the light-shielding layer or the black matrix in the electronic device 10 can be reduced), thus helping to increase the aperture ratio of the pixel.

In accordance with some embodiments, the via hole V3 and the via hole V2 do not overlap in the normal direction of the substrate 102 (e.g., the Z direction in the drawing). With such an arrangement, the uneven topography caused by the overlapping of the via hole V3 and the via hole V2 can be reduced, so that the damage or fracture of the insulating layer 118, the conductive layer 210, or the conductive layer 212 formed subsequently can be reduced. In this way, the occurrence of short circuit or open circuit can be reduced.

Furthermore, in accordance with some embodiments, in a cross-sectional view, the via hole V3 has a sidewall 116s, and there is an included angle θ between the sidewall 116s and the top surface 102t of the substrate 102. The included angle θ may be greater than or equal to 30 degrees and less than 90 degrees (30 degrees≤included angle θ<90 degrees), for example, about 35 degrees, about 40 degrees, about 45 degrees, about 50 degrees, about degrees, about 60 degrees, about 65 degrees, about 70 degrees, about 75 degrees, about degrees or about 85 degrees. It should be understood that the position of the included angle shown in the drawings is only for illustration. Specifically, the included angle θ refers to the included angle between the extension line of the sidewall 116s and the top surface 102t of the substrate 102. In addition, when the sidewall 116s is not a straight line, the included angle between the tangent extension line of the sidewall 116s at half of the maximum thickness of the insulating layer 116 and the top surface 102t of the substrate 102 can be taken as the included angle θ. It should be noted that when the sidewall 116s of the via hole V3 is configured in the aforementioned manner (for example, 30 degrees≤angle θ<90 degrees), the via hole V3 has a relatively steep slope of angle, which can reduce the area of the via hole V3, so that the area of the corresponding light-shielding layer 202 can be reduced, and the aperture ratio of the pixel can be improved.

In accordance with some embodiments, the insulating layer 116 can also serve as a planarization layer. In accordance with some embodiments, the material of the insulating layer 116 includes an organic material, an inorganic material, another suitable material or combinations thereof, but is not limited thereto. In accordance with some embodiments, the organic material may include epoxy resin, silicone resin, acrylic resin (such as polymethylmethacrylate (PMMA)), polyimide, perfluoroalkoxy alkane (PFA), another suitable material, or a combination thereof, but is not limited thereto. In accordance with some embodiments, the inorganic material may include silicon nitride, silicon oxide, silicon oxynitride, aluminum oxide, another suitable material or a combination thereof, but is not limited thereto. In accordance with some embodiments, the insulating layer 116 may be formed by a chemical vapor deposition process, a coating process, a printing process, another suitable process, or a combination thereof. In addition, a planarization process may be performed on the insulating layer 116 to have a substantially flat top surface. In accordance with some embodiments, the planarization process may include a grinding process, a chemical-mechanical polish (CMP) process, another suitable planarization process, or a combination thereof.

Furthermore, the pixel electrode 208 includes a transparent conductive material. In accordance with some embodiments, the material of the pixel electrode 208 includes transparent conductive oxide (TCO), for example, may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material or a combination thereof, but is not limited thereto. In accordance with some embodiments, the pixel electrode 208 may be formed by a chemical vapor deposition process, a spin coating process, another suitable method, or a combination thereof. Also, the pixel electrode 208 may be patterned by one or more photolithography processes and/or etching processes.

In addition, in accordance with some embodiments, the electronic device 10 further includes an insulating layer 118, a conductive layer 210, a conductive layer 212, and an insulating layer 120. The insulating layer 118 is disposed on the pixel electrode 208 and the insulating layer 116 and extends over in the via hole V3. Furthermore, the conductive layer 212 can be disposed on the conductive layer 210, and the conductive layer 210 and the conductive layer 212 can be disposed on the insulating layer 118 and extend in the via hole V3. In accordance with some embodiments, the conductive layer 210 at least partially overlaps the gate electrode 204 in the normal direction of the substrate 102 (for example, the Z direction in the drawing), and the conductive layer 210 does not overlap the first via hole V1 and the second via hole V2 in the normal direction of the substrate 102. Moreover, in accordance with some embodiments, the conductive layer 212 at least partially overlaps the gate electrode 204 in the normal direction of the substrate 102. In addition, the insulating layer 120 is disposed on the conductive layer 210 and the insulating layer 118, and the insulating layer 120 also extends in the via hole V3. In accordance with some embodiments, the conductive layer 210 and the conductive layer 212 are electrically connected to a common electrode.

The material and forming method of the insulating layer 118 is the same as or similar to those of the aforementioned insulating layer 114, and will not be repeated here. In accordance with some embodiments, the insulating layer 120 can also serve as a planarization layer, and the material and forming method of the insulating layer 120 can be the same or similar to those of the aforementioned insulating layer 116, which will not be repeated here. In some embodiments, the insulating layer 120 can serve as a spacer, or be disposed overlapping another spacer of the opposite substrate as a spacer.

In accordance with some embodiments, the conductive layer 210 includes a metal material, such as copper (Cu), aluminum (Al), molybdenum (Mo), tungsten (W), gold (Au), silver (Ag), tin (Sn), chromium (Cr), nickel (Ni), platinum (Pt), titanium (Ti), iridium (Jr), rhodium (Rh), alloys of the foregoing metals, another suitable conductive material, or a combination thereof, but is not limited thereto. Furthermore, in accordance with some embodiments, the conductive layer 212 included the aforementioned transparent conductive material. In accordance with some embodiments, the conductive layer 210 and the conductive layer 212 may be formed by a chemical vapor deposition process, a spin coating process, a physical vapor deposition process, an electroplating process, an electroless plating process, another suitable method, or a combination thereof. Moreover, the conductive layer 210 and the conductive layer 212 may be patterned by one or more photolithography processes and/or etching processes.

Figure 4:
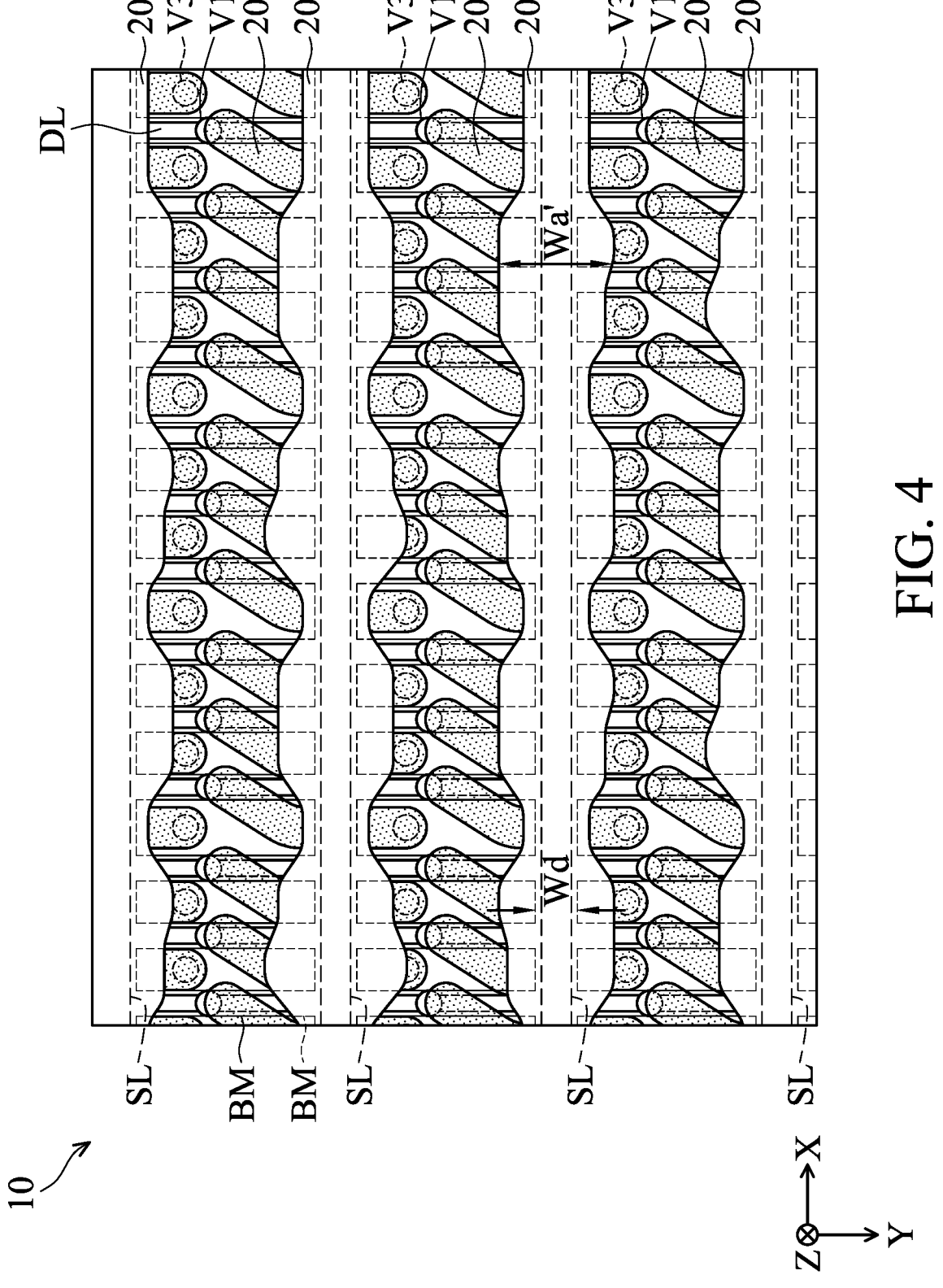
FIG. 4 is a partial bottom-view diagram of an electronic device in accordance with some embodiments of the present disclosure.

In addition, in accordance with some embodiments, the electronic device 10 further includes a light-shielding layer 202. The light-shielding layer 202 is disposed between the substrate 102 and the thin-film transistor 100T, and the via hole V3 at least partially overlaps the light-shielding layer 202 in the normal direction of the substrate 102. Specifically, in accordance with some embodiments, the light-shielding layer 202 is disposed on the insulating layer 104, and the insulating layer 106 is disposed on the light-shielding layer 202. The light-shielding layer 202 can be electrically connected to the gate electrode 204, electrically connected to a circuit for providing a bias signal, or grounded, but is not limited thereto. It should be noted that the light-shielding layer 202 can be used to replace part of the black matrix BM (for example, as shown in FIG. 4) disposed on the opposite substrate (not illustrated, the substrate opposite to the substrate 102, for example, which can be used as a color filter substrate) to shield the light leakage of the via hole V3, or to reduce the problem of decreasing aperture ratio caused by dislocation of the black matrix after the substrate 102 and the opposite substrate are aligned and assembled.

In accordance with some embodiments, in a cross-sectional view, a width Wa of the light-shielding layer 202 is greater than a width Wc of the via hole V3. In accordance with some embodiments, the via hole V3 has a depth d, and the depth d is a distance from the upper surface of the insulating layer 116 to the bottom of the via hole V3 (for example, the bottom surface that is closest to the substrate 102) in the normal direction of the substrate 102 (for example, the Z direction in the drawing). Accordingly, the width Wc of the via hole V3 may be, for example, the width measured at a distance of 0.99*d from the bottom of the via hole V3, but the present disclosure is not limited thereto. Furthermore, in accordance with some embodiments, the width Wa of the light-shielding layer 202 is greater than a width Wb of the gate electrode 204. Specifically, the width Wa and the width Wb respectively refer to the maximum widths of the light-shielding layer 202 and the gate electrode 204 in a cross-sectional view. Alternatively, the width Wa and the width Wb respectively refer to the maximum widths of the light-shielding layer 202 and the gate electrode 204 in a cross-section along the extending direction of the data line DL (for example, the X-Z plane in the drawing). It should be noted that when the width Wa of the light-shielding layer 202 is greater than the width Wc of the via hole V3 and/or the width Wb of the gate electrode 204, the light-shielding layer 202 can effectively shield the light leakage of the via hole V3, or reduce the problem of the decrease of aperture ratio caused by the dislocation of the black matrix It should be understood that, in accordance with the embodiments of the present disclosure, an optical microscope (OM), a scanning electron microscope (SEM), a film thickness profiler (α-step), an ellipsometer or another suitable method may be used to measure the distance, spacing or angle between elements, or the width, or thickness of each element. Specifically, in accordance with some embodiments, a scanning electron microscope may be used to obtain a cross-sectional image including the elements to be measured, and the distance, spacing or angle between elements, or the width, or thickness of each element in the image can be measured.

As described above, the electronic device 10 has a display area (not illustrated) and a non-display area (not illustrated) adjacent to the display area. In accordance with some embodiments, the conductive layer to which the light-shielding layer 202 belongs extends from the non-display area to the display area, and the thickness of the conductive layer to which the light-shielding layer 202 belongs in the non-display area is smaller than that in the display area. Specifically, the conductive layer to which the light-shielding layer 202 belongs in the non-display area is called a conductive layer (not illustrated), and this conductive layer is disposed in the non-display area. The light-shielding layer 202 is disposed in the display area. The conductive layer and the light-shielding layer 202 belong to the same layer level, and the thickness of the conductive layer is smaller than that of the light-shielding layer 202. In accordance with some embodiments, the aforementioned conductive layer belonging to the same layer as the light-shielding layer 202 and the light-shielding layer 202 may be formed by the same process. It should be noted that, since the light-shielding layer 202 located in the display area is relatively thick, it can have a better light-shielding effect.

In accordance with some embodiments, the material of the light-shielding layer 202 includes metal materials, such as copper (Cu), aluminum (Al), molybdenum (Mo), tungsten (W), gold (Au), silver (Ag), tin (Sn), chromium (Cr), nickel (Ni), platinum (Pt), titanium (Ti), iridium (Jr), rhodium (Rh), alloys of the aforementioned metals, another suitable conductive material, or a combination thereof, but is not limited thereto. In accordance with some embodiments, the light-shielding layer 202 may be formed by a chemical vapor deposition process, a spin coating process, a physical vapor deposition process, an electroplating process, an electroless plating process, another suitable method, or a combination thereof. Moreover, the light-shielding layer 202 may be patterned by one or more photolithography processes and/or etching processes.

Next, please refer to FIG. 4. FIG. 4 is a partial bottom-view diagram of the electronic device 10 in accordance with some embodiments of the present disclosure. As shown in FIG. 4, the electronic device 10 includes a scan line SL extending along a first direction (for example, the X direction in the drawing). Furthermore, as described above, the electronic device 10 includes a black matrix BM disposed on the substrate (for example, a color filter substrate) opposite to the substrate 102. In addition, the black matrix BM at least partially overlaps the thin-film transistor 100T in the normal direction (for example, the normal direction of the top surface 102t of the substrate 102, the Z direction in the drawing). In accordance with some embodiments, the light-shielding layer 202 has a width Wa' in a second direction (for example, the Y direction in the drawing) perpendicular to the first direction, and a portion of the black matrix BM extends along the first direction and has a width Wd (for example, the minimum width) in the second direction. Moreover, the Wd of the black matrix BM is smaller than the width Wa' of the light-shielding layer 202. In addition, in accordance with some embodiments, the width Wa' of the light-shielding layer 202 varies along the first direction. That is, the width Wa' of the light-shielding layer 202 is not uniform along the first direction. In accordance with some embodiments, the area of the light-shielding layer 202 with a smaller width Wa' corresponds to the red pixel area, and the area of the light-shielding layer 202 with a larger width Wa' corresponds to the blue pixel area, but is not limited thereto.

To summarize the above, according to the embodiments of the present disclosure, the electronic device provided includes a thin-film transistor. In the thin-film transistor, a semiconductor layer and a transfer element (for example, a source electrode or a drain electrode) connecting the semiconductor layer and a pixel electrode are configured in a specific manner. The aperture ratio of the pixel therefore can be effectively increased, and the performance of the electronic device can be improved.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Thus, the appended claims are intended to include within their scope such processes, machines, manufacture, compositions of matter, means, methods or steps. Moreover, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
a substrate;
a thin-film transistor disposed on the substrate and comprising a semiconductor layer, a gate electrode, a source electrode and a drain electrode, wherein the semiconductor layer comprises a metal oxide;
a first insulating layer disposed on the thin film-transistor and having a first via hole;
a pixel electrode disposed on the first insulating layer and electrically connected to either the source electrode or the drain electrode through the first via hole;
a light-shielding layer disposed between the substrate and the thin-film transistor, wherein the first via hole at least partially overlaps the light-shielding layer in a normal direction of the substrate; and
a scan line and a black matrix, wherein the scan line extends along a first direction, the black matrix at least partially overlaps the thin-film transistor in the normal direction, wherein the light-shielding layer has a fourth width in a second direction perpendicular to the first direction, a portion of the black matrix extends along the first direction and has a fifth width in the second direction, and the fifth width is smaller than the fourth width,
wherein the first via hole at least partially overlaps the gate electrode in a normal direction.

2. The electronic device as claimed in claim 1, wherein either the source electrode or the drain electrode is formed of a transparent conductive material.

3. The electronic device as claimed in claim 1, wherein in a cross-sectional view, the first via hole has a sidewall, and an included angle between the sidewall and a top surface of the substrate is greater than or equal to 30 degrees and less than 90 degrees.

4. The electronic device as claimed in claim 1, wherein in a cross-sectional view, a first width of the light-shielding layer is greater than a second width of the first via hole.

5. The electronic device as claimed in claim 4, wherein in the cross-sectional view, the first width is greater than a third width of the gate electrode.

6. The electronic device as claimed in claim 1, wherein the fourth width of the light-shielding layer varies along the first direction.

7. The electronic device as claimed in claim 1, wherein the black matrix at least partially overlaps the thin-film transistor in the normal direction.

8. The electronic device as claimed in claim 1, wherein an area of the light-shielding layer with the smaller fourth width corresponds to a red pixel area, and an area of the light-shielding layer with the larger fourth width corresponds to a blue pixel area.

9. The electronic device as claimed in claim 1, wherein the electronic device has a display area and a non-display area adjacent to the display area, and the electronic device further comprises a conductive layer, the conductive layer is disposed in the non-display area, and the light-shielding layer is disposed in the display area, wherein the conductive layer and the light-shielding layer belong to the same layer level, and a thickness of the conductive layer is smaller than a thickness of the light-shielding layer.

10. The electronic device as claimed in claim 1, wherein the light-shielding layer is electrically connected to the gate electrode, electrically connected to a circuit for providing a bias signal, or grounded.

11. The electronic device as claimed in claim 1, further comprising a second insulating layer, wherein the second insulating layer is disposed between the semiconductor layer and the first insulating layer and has a second via hole, wherein either the source electrode or the drain electrode is electrically connected to the semiconductor layer through the second via hole, and the first via hole and the second via hole do not overlap in the normal direction.

12. The electronic device as claimed in claim 1, wherein the pixel electrode at least partially overlaps the gate electrode in the normal direction.

13. The electronic device as claimed in claim 1, wherein the electronic device has a display area and a non-display area adjacent to the display area, and the electronic device further comprises another thin-film transistor, wherein the other thin-film transistor comprises another semiconductor layer including polysilicon, and the thin-film transistor is disposed in the display area, and the other thin-film transistor is disposed in the non-display area.

14. The electronic device as claimed in claim 1, wherein the metal oxide comprises indium gallium zinc oxide (IGZO), indium zinc oxide (IZO), indium gallium oxide (IGO), indium gallium zinc tin oxide (IGZTO), or a combination thereof.

15. The electronic device as claimed in claim 1, wherein the semiconductor layer is formed of a light-transmitting metal oxide.

16. The electronic device as claimed in claim 1, wherein the first via hole is disposed above the gate electrode.

17. The electronic device as claimed in claim 1, wherein the source electrode is electrically connected to a data line, and the drain electrode is electrically connected to the pixel electrode.

18. The electronic device as claimed in claim 1, wherein the gate electrode is electrically connected to the scan line.

* * * * *